(12) United States Patent
Delacruz et al.

(10) Patent No.: US 11,139,283 B2
(45) Date of Patent: Oct. 5, 2021

(54) ABSTRACTED NAND LOGIC IN STACKS

(71) Applicant: Xcelsis Corporation, San Jose, CA (US)

(72) Inventors: Javier A. Delacruz, San Jose, CA (US); Stephen Morein, San Jose, CA (US)

(73) Assignee: Xcelsis Corporation, San Jose, CA (US)

( * ) Notice: Subject to any disclaimer, the term of this patent is extended or adjusted under 35 U.S.C. 154(b) by 0 days.

(21) Appl. No.: 16/533,003

(22) Filed: Aug. 6, 2019

(65) Prior Publication Data

US 2020/0203330 A1 Jun. 25, 2020

Related U.S. Application Data

(60) Provisional application No. 62/784,426, filed on Dec. 22, 2018.

(51) Int. Cl.
| | |
|---|---|
| *H01L 25/18* | (2006.01) |
| *H01L 23/00* | (2006.01) |
| *H01L 25/065* | (2006.01) |
| *H01L 25/00* | (2006.01) |

(52) U.S. Cl.
CPC .............. *H01L 25/18* (2013.01); *H01L 24/48* (2013.01); *H01L 24/49* (2013.01); *H01L 25/0657* (2013.01); *H01L 25/50* (2013.01); *H01L 2224/48091* (2013.01); *H01L 2224/48106* (2013.01); *H01L 2224/48227* (2013.01); *H01L 2224/49176* (2013.01); *H01L 2225/0651* (2013.01); *H01L 2225/06562* (2013.01); *H01L 2225/06582* (2013.01)

(58) Field of Classification Search
CPC ..... G11C 5/063; G11C 5/025; H01L 25/0657; H01L 2225/06565
See application file for complete search history.

(56) References Cited

U.S. PATENT DOCUMENTS

| | | | |
|---|---|---|---|
| 5,453,701 A * | 9/1995 | Jensen | G01R 1/07314 324/750.05 |
| 5,739,067 A | 4/1998 | DeBusk et al. | |
| 6,337,510 B1 * | 1/2002 | Chun-Jen | H01L 23/3107 257/666 |

(Continued)

*Primary Examiner* — Victoria K. Hall
(74) *Attorney, Agent, or Firm* — Lerner, David, Littenberg, Krumholz & Mentlik, LLP

(57) ABSTRACT

A microelectronic package may include a substrate having first and second surfaces each extending in first and second directions, a NAND wafer having a memory storage array, a bitline driver chiplet configured to function as a bitline driver, and a wordline driver chiplet configured to function as a wordline driver. The NAND wafer may be coupled to the first surface of the substrate, and the bitline and wordline driver chiplets may each be mounted to a front surface of the NAND wafer. The NAND wafer may have element contacts electrically connected with conductive structure of the substrate. The bitline and wordline driver chiplets may be elongated along the first and second directions, respectively. Front surfaces of the bitline driver chiplet and the wordline driver chiplet may be arranged in a single common plane and may be entirely contained within an outer periphery of the front surface of the NAND wafer.

23 Claims, 3 Drawing Sheets

(56) References Cited

U.S. PATENT DOCUMENTS

| | | | |
|---|---|---|---|
| 6,514,794 B2* | 2/2003 | Haba | H01L 23/3128 438/109 |
| 6,728,161 B1 | 4/2004 | Roohparvar | |
| 6,869,827 B2* | 3/2005 | Vaiyapuri | H01L 21/563 257/723 |
| 6,906,361 B2 | 6/2005 | Zhang | |
| 6,962,835 B2 | 11/2005 | Tong et al. | |
| 7,049,684 B2* | 5/2006 | Minamio | H01L 21/565 257/666 |
| 7,354,809 B2 | 4/2008 | Yuan et al. | |
| 7,593,263 B2 | 9/2009 | Sokolov et al. | |
| 7,645,638 B2* | 1/2010 | Kim | H01L 23/3135 438/123 |
| 7,700,409 B2* | 4/2010 | Jensen | H01L 25/0657 438/109 |
| 7,759,783 B2* | 7/2010 | Lee | H01L 25/03 257/686 |
| 7,772,708 B2* | 8/2010 | Leddige | H01L 25/0657 257/786 |
| 7,829,990 B1* | 11/2010 | Scanlan | H01L 25/105 257/686 |
| 7,888,185 B2* | 2/2011 | Corisis | H01L 25/0657 438/123 |
| 7,968,440 B2 | 6/2011 | Seebauer | |
| 7,999,367 B2* | 8/2011 | Kang | G11C 5/063 257/686 |
| 8,148,806 B2* | 4/2012 | Lin | H05K 1/0231 257/686 |
| 8,199,510 B2* | 6/2012 | Huang | H01L 25/0655 361/721 |
| 8,242,607 B2* | 8/2012 | Chin | H01L 24/49 257/777 |
| 8,372,741 B1* | 2/2013 | Co | H01L 24/49 438/617 |
| 8,399,974 B1* | 3/2013 | Huneke | H01L 24/29 257/686 |
| 8,502,368 B2* | 8/2013 | Gillingham | H01L 21/82 257/686 |
| 8,581,349 B1 | 11/2013 | Sekar et al. | |
| 8,735,219 B2 | 5/2014 | Enquist et al. | |
| 8,866,281 B2* | 10/2014 | Huang | H01L 25/0652 257/686 |
| 8,963,310 B2* | 2/2015 | Desai | H01L 25/0657 257/686 |
| 9,437,582 B2* | 9/2016 | Gibson | H01L 25/105 |
| 9,686,852 B2* | 6/2017 | Semmelmeyer | H05K 1/144 |
| 10,522,522 B2* | 12/2019 | Song | H01L 23/488 |
| 10,963,022 B2* | 3/2021 | Steely, Jr. | G06F 15/76 |
| 2003/0209740 A1* | 11/2003 | Miyamoto | H01L 24/06 257/286 |
| 2004/0021230 A1* | 2/2004 | Tsai | H01L 24/73 257/777 |
| 2006/0267173 A1* | 11/2006 | Takiar | H01L 25/0657 257/686 |
| 2008/0029868 A1* | 2/2008 | Lee | H01L 25/105 257/686 |
| 2008/0054493 A1* | 3/2008 | Leddige | H01L 25/0657 257/786 |
| 2008/0171405 A1* | 7/2008 | Yee | H01L 25/03 438/109 |
| 2009/0039492 A1* | 2/2009 | Kang | G11C 5/025 257/686 |
| 2009/0230517 A1* | 9/2009 | Bathan | H01L 25/03 257/666 |
| 2011/0305100 A1* | 12/2011 | Yu | G11C 5/025 365/226 |
| 2013/0020707 A1 | 1/2013 | Or-Bach et al. | |
| 2013/0082391 A1* | 4/2013 | Crisp | H01L 23/49816 257/773 |
| 2013/0105939 A1* | 5/2013 | Domae | H01L 25/0652 257/528 |
| 2013/0178024 A1 | 7/2013 | Flachowsky et al. | |
| 2015/0019802 A1 | 1/2015 | Kamal et al. | |
| 2015/0091158 A1* | 4/2015 | Lin | H01L 25/0657 257/737 |
| 2015/0115438 A1* | 4/2015 | Lee | H01L 25/0657 257/737 |
| 2015/0302901 A1* | 10/2015 | Crisp | G11C 11/408 365/51 |
| 2016/0071831 A1* | 3/2016 | Lee | H01L 23/3135 257/690 |
| 2018/0366398 A1* | 12/2018 | Hoshino | B23K 1/0016 |
| 2019/0029132 A1* | 1/2019 | Haba | H05K 5/0065 |
| 2019/0051634 A1* | 2/2019 | Park | H01L 25/043 |
| 2019/0088625 A1* | 3/2019 | Kawasaki | H01L 24/81 |
| 2019/0097362 A1* | 3/2019 | Haba | G06N 3/0481 |
| 2019/0189591 A1* | 6/2019 | Zhang | H01L 23/5385 |
| 2019/0280408 A1* | 9/2019 | Haba | H01R 12/716 |
| 2019/0280421 A1* | 9/2019 | Haba | H01R 13/6205 |
| 2019/0280428 A1* | 9/2019 | Haba | G06N 3/0454 |
| 2019/0296001 A1* | 9/2019 | Ohda | H01L 24/81 |
| 2020/0013753 A1* | 1/2020 | Kim | H01L 23/481 |
| 2020/0051961 A1* | 2/2020 | Rickard | H01L 23/5385 |
| 2020/0105735 A1 | 4/2020 | Park et al. | |

* cited by examiner

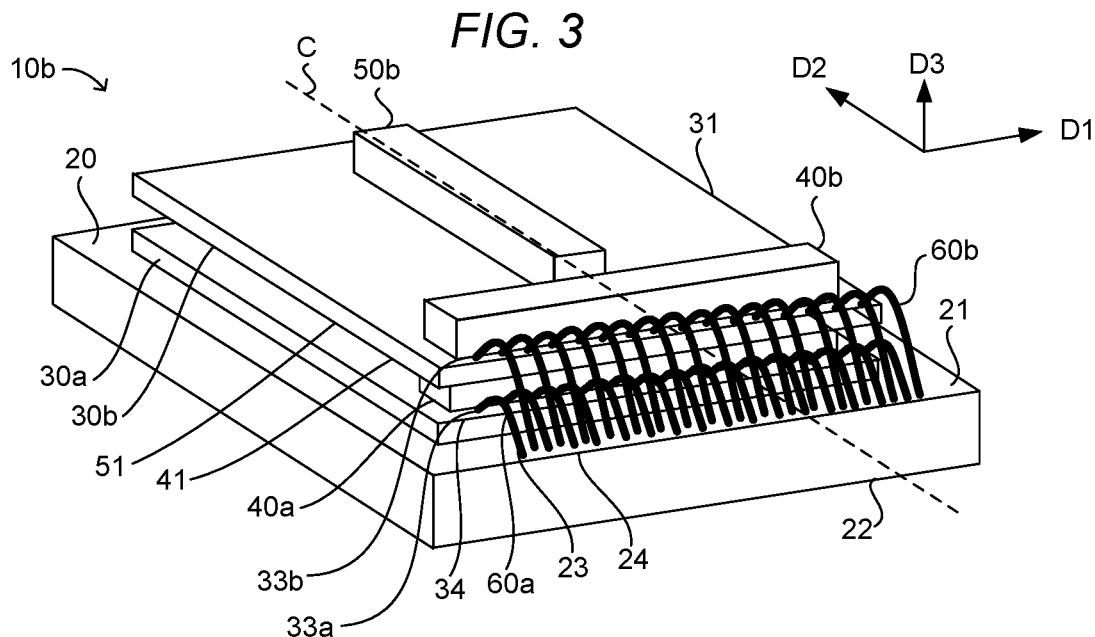
FIG. 3
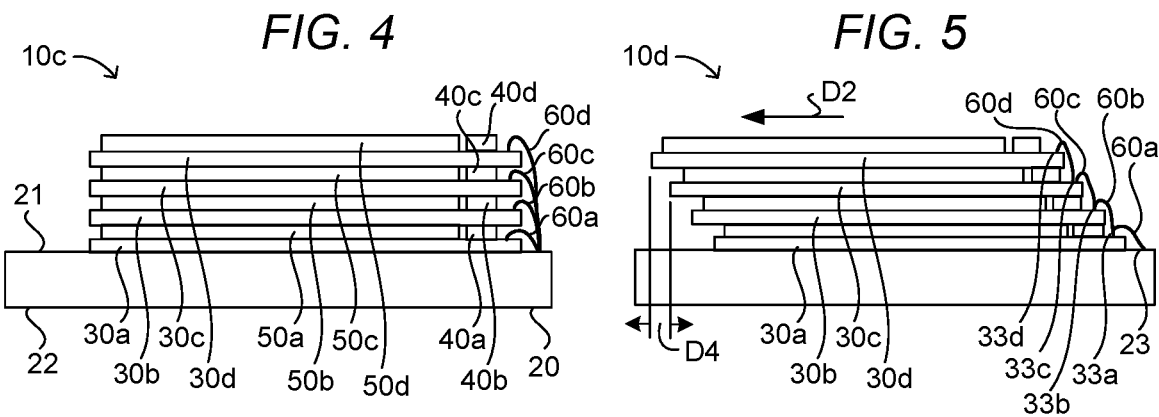
FIG. 4
FIG. 5
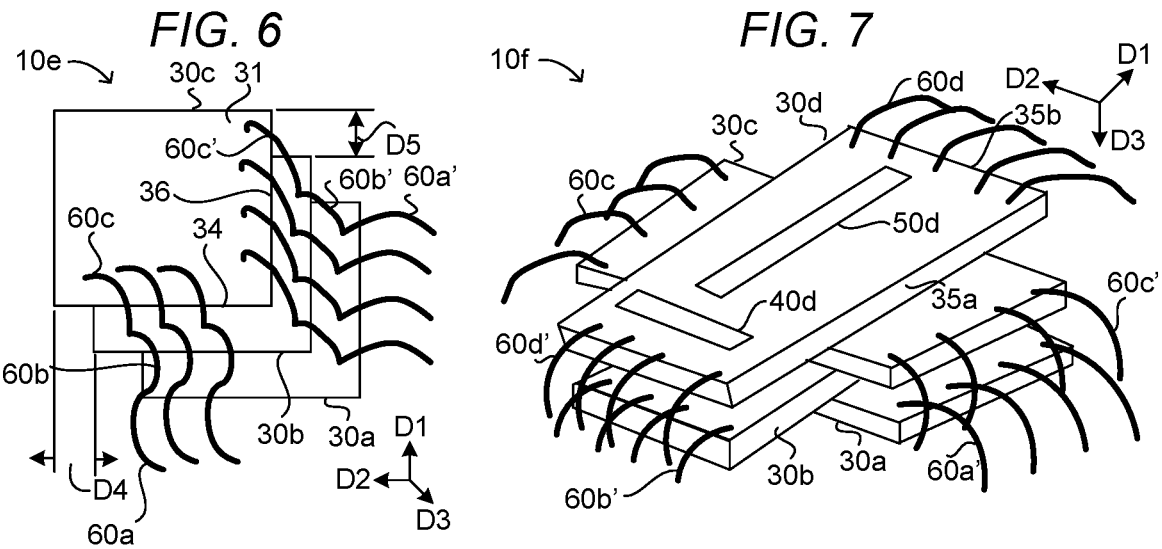
FIG. 6
FIG. 7

ABSTRACTED NAND LOGIC IN STACKS

CROSS-REFERENCE TO RELATED APPLICATIONS

This application claims the benefit of the filing date of U.S. Provisional Patent Application No. 62/784,426, filed Dec. 22, 2018, the disclosure of which is hereby incorporated herein by reference.

BACKGROUND OF THE INVENTION

NAND memory is a non-volatile storage technology. NAND memory provides large storage capacity with quick access times and low power usage within a robust package, making it commonplace in many modern electronic devices, such as solid-state hard drives, smart phones, flash drives, memory cards, computers, etc. The density of NAND memory, which is the number of memory cells found on a single die, defines the storage capacity for NAND memory.

NAND memory includes logic for handling the reading and writing of the NAND memory cells and the input and output (I/O) from the NAND memory. In other words, the logic controls the NAND memory's operation and communication with other components, such as processors. The logic is typically constructed as complementary metal-oxide-semiconductor (CMOS) circuits. The memory section in the NAND memory includes bitlines, wordlines, and memory cells.

Stacked NAND, which is conventionally formed by combining a discrete logic section formed on one die with a memory section formed on another die may not have an optimal density, due to the bitlines and wordlines only taking up a small portion of a microelectronic element that is arranged in a stack with a microelectronic element having NAND memory. Therefore, despite the advances that have been made in stacked NAND, there is still a need for further improvements.

BRIEF SUMMARY OF THE INVENTION

One aspect of the disclosure provides a microelectronic package, comprising a substrate having first and second opposite surfaces each extending in first and second orthogonal directions; a NAND wafer having a memory storage array therein, the NAND wafer having element contacts electrically connected with electrically conductive structure of the substrate, the NAND wafer being coupled to the first surface of the substrate; a bitline driver chiplet configured to function as a bitline driver for the NAND wafer, the bitline driver chiplet being elongated along the first direction and mounted to a front surface of the NAND wafer; and a wordline driver chiplet configured to function as a wordline driver for the NAND wafer, the wordline driver chiplet being elongated along the second direction and mounted to the front surface of the NAND wafer. Front surfaces of the bitline driver chiplet and the wordline driver chiplet may be arranged in a single common plane and are entirely contained within an outer periphery of the front surface of the NAND wafer.

According to some examples, the bitline driver chiplet is disposed adjacent to a first peripheral edge of the front surface of the NAND wafer, and the wordline driver chiplet is disposed along a centerline of the front surface that bisects the first peripheral edge. The front surface of the bitline driver chiplet and the front surface of the wordline driver chiplet may be directly bonded to the front surface of the NAND wafer without the use of an adhesive.

In some examples, the bitline driver chiplet may be a first bitline driver chiplet and the wordline driver chiplet is a first wordline driver chiplet, the microelectronic package further comprising a plurality of bitline driver chiplets including the first bitline driver chiplet and a plurality of wordline driver chiplets including the first wordline driver chiplet, each of the bitline driver chiplets being spaced apart from one another, elongated along the first direction, and mounted to the front surface of the NAND wafer, and each of the wordline driver chiplets being spaced apart from one another, elongated along the second direction, and mounted to the front surface of the NAND wafer.

The microelectronic package may further include a plurality of wire bonds extending above the front surface of the NAND wafer, the plurality of wire bonds extending between the element contacts and substrate contacts at the first surface of the substrate.

According to some examples, the NAND wafer is a first NAND wafer, the microelectronic package further comprising a plurality of NAND wafers including the first NAND wafer, the plurality of NAND wafers being arranged in a vertical stack and coupled to the first surface of the substrate. Further in such examples, the bitline driver chiplet may be configured to function as a bitline driver that is shared by each of the plurality of NAND wafers, and the wordline driver chiplet may be configured to function as a wordline driver that is shared by each of the plurality of NAND wafers. The microelectronic package may further include a plurality of wire bonds extending above the front surface of the first NAND wafer, the plurality of wire bonds extending between the element contacts of the first NAND wafer and substrate contacts at the first surface of the substrate, the plurality of wire bonds being configured to carry address information and data signals to each of the plurality of NAND wafers. An upper surface of each of the plurality of NAND wafers that is below the first NAND wafer may be directly bonded to a lower surface of the NAND wafer that is directly thereabove in the stack without the use of an adhesive. The bitline driver chiplet is a first bitline driver chiplet and the wordline driver chiplet may be a first wordline driver chiplet, the microelectronic package further comprising a plurality of bitline driver chiplets including the first bitline driver chiplet and a plurality of wordline driver chiplets including the first wordline driver chiplet, each of the bitline driver chiplets and each of the wordline driver chiplets being mounted to a corresponding one of the plurality of NAND wafers. The microelectronic package may further include a plurality of groups of wire bonds, each group of wire bonds extending above the front surface of a respective one of the NAND wafers, each group of wire bonds extending between element contacts of the respective one of the NAND wafers and substrate contacts at the first surface of the substrate. A plurality of NAND wafers may be arranged in a staircase configuration, such that each of the plurality of NAND wafers that is below the first NAND wafer is horizontally offset from the NAND wafer that is directly thereabove in the stack by an offset distance in either the first direction or the second direction. The microelectronic package may further include a plurality of groups of wire bonds, each group of wire bonds extending above the front surface of a respective one of the NAND wafers, element contacts of each of the plurality of NAND wafers that is below the first NAND wafer being connected to element contacts of the NAND wafer that is directly thereabove in the stack by one of the groups of wire bonds. In other examples, the plurality of NAND wafers may be arranged in a staircase configuration, such that each of the plurality of NAND wafers that is below the first NAND wafer is horizontally offset from the NAND wafer that is directly thereabove in the stack by a first offset distance in the first direction and by a second offset distance in the second direction. In such examples, the microelectronic package may further include a plurality of groups of wire bonds, each group of wire bonds extending above the front surface of a respective one of the NAND wafers, element contacts of each of the plurality of NAND wafers that is below the first NAND wafer being connected to element contacts of the NAND wafer that is directly thereabove in the stack by one of the groups of wire bonds, each group of wire bonds having a first subset that extends over a first edge of the respective one of the NAND wafers and a second subset that extends over a second edge of the respective one of the NAND wafers adjacent to the first edge. In yet further examples, the plurality of NAND wafers may be arranged in an alternating orthogonal configuration, such that long sides of each of the plurality of NAND wafers that is below the first NAND wafer are rotated 90° relative to long sides of the NAND wafer that is directly thereabove in the stack. In such examples, the package may further include a plurality of groups of wire bonds, each group of wire bonds extending above the front surface of a respective one of the NAND wafers, each group of wire bonds extending between element contacts of the respective one of the NAND wafers and substrate contacts at the first surface of the substrate, each group of wire bonds having a first subset that extends over a first short edge of the respective one of the NAND wafers and a second subset that extends over a second edge of the respective one of the NAND wafers opposite from the first edge.

Another aspect of the disclosure provides a system comprising a microelectronic package and one or more other electronic components electrically connected to the microelectronic package. The microelectronic microelectronic package may include a substrate having first and second opposite surfaces each extending in first and second orthogonal directions; a NAND wafer having a memory storage array therein, the NAND wafer having element contacts electrically connected with electrically conductive structure of the substrate, the NAND wafer being coupled to the first surface of the substrate; a bitline driver chiplet configured to function as a bitline driver for the NAND wafer, the bitline driver chiplet being elongated along the first direction and mounted to a front surface of the NAND wafer; and a wordline driver chiplet configured to function as a wordline driver for the NAND wafer, the wordline driver chiplet being elongated along the second direction and mounted to the front surface of the NAND wafer. Front surfaces of the bitline driver chiplet and the wordline driver chiplet may be arranged in a single common plane and are entirely contained within an outer periphery of the front surface of the NAND wafer. In some examples, the system may further include a housing, the microelectronic package and the other electronic components being mounted to the housing.

Yet another aspect of the disclosure provides a microelectronic package, including a substrate having first and second opposite surfaces each extending in first and second orthogonal directions; a plurality of microelectronic elements arranged in a vertical stack and coupled to the first surface of the substrate; the microelectronic elements each having element contacts electrically connected with electrically conductive structure of the substrate; and a plurality of chiplets arranged within the vertical stack and coupled to the plurality of microelectronic elements, the chiplets being alternatingly interleaved with the microelectronic elements within the vertical stack, circuitry of each of the chiplets being electrically connected with circuitry of at least one of the microelectronic elements, wherein front surfaces of each of the chiplets are smaller in at least one of the first and second directions than front surfaces of each of the microelectronic elements, and front surfaces of each of the chiplets are entirely contained within an outer periphery of the front surfaces of each of the microelectronic elements.

A further aspect of the disclosure provides a method of assembling a microelectronic package. Such method may include providing a substrate having first and second opposite surfaces each extending in first and second orthogonal directions; coupling a NAND wafer to the first surface of the substrate, the NAND wafer having a memory storage array therein; electrically connecting element contacts of the NAND wafer with electrically conductive structure of the substrate; mounting a bitline driver chiplet to a front surface of the NAND wafer, the bitline driver chiplet configured to function as a bitline driver for the NAND wafer, the bitline driver chiplet being elongated along the first direction; and mounting a wordline driver chiplet to the front surface of the NAND wafer, the wordline driver chiplet configured to function as a wordline driver for the NAND wafer, the wordline driver chiplet being elongated along the second direction, wherein front surfaces of the bitline driver chiplet and the wordline driver chiplet are arranged in a single common plane and are entirely contained within an outer periphery of the front surface of the NAND wafer.

BRIEF DESCRIPTION OF THE DRAWINGS

FIG. 3 is a perspective view of a microelectronic package having stacked NAND wafers with wire bonds to a substrate and bitline and wordline driver chiplets for each wafer.

FIG. 4 is a cross-section of a variation of the microelectronic package of FIG. 3, in which the stacked NAND wafers are vertically aligned.

FIG. 5 is a cross-section of a variation of the microelectronic package of FIG. 3, in which the stacked NAND wafers are arranged in a unidirectional waterfall configuration.

FIG. 6 is a perspective view of a variation of the stacked NAND wafers of FIG. 3, in which the stacked NAND wafers are arranged in a bidirectional waterfall configuration.

FIG. 7 is a perspective view of a variation of the stacked NAND wafers of FIG. 3, in which two groups of the stacked NAND wafers are arranged orthogonally to one another within the stack.

DETAILED DESCRIPTION

Figure 1:
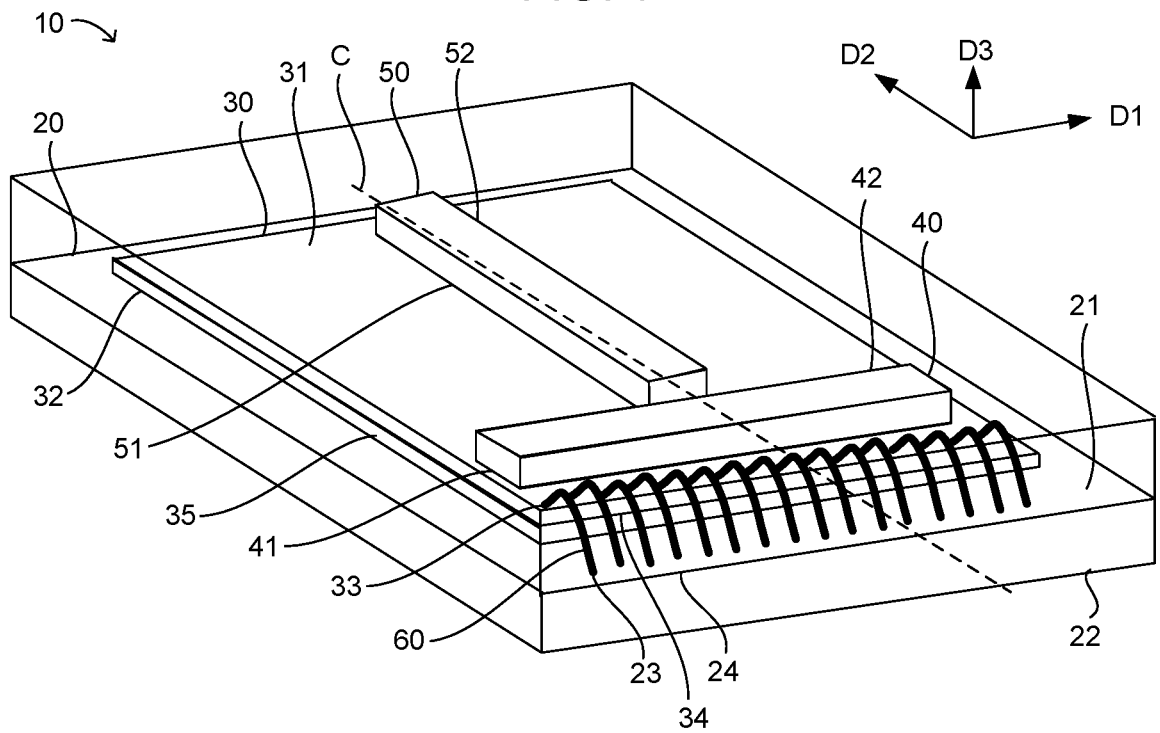
FIG. 1 is a perspective view of a microelectronic package having a NAND wafer and bitline and wordline driver chiplets.

As illustrated in FIG. 1, a microelectronic package 10 may comprise a substrate 20 having first and second surfaces 21, 22, a NAND wafer 30 mounted to the first surface, a bitline driver chiplet 40, a wordline driver chiplet 50, and wire bonds 60. The substrate 20 defines first and second opposite surfaces 21, 22 that may each extend in a first direction D1 and in a second direction D2 transverse to the first direction.

As used in this disclosure with reference to the substrate 20 or another element having a planar surface, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. In some embodiments, the conductive element may be attached to the surface or may be disposed in one or more layers of dielectric coating on the said surface.

In FIG. 1, the first and second directions D1, D2 are referred to herein as "horizontal" or "lateral" directions, whereas the directions perpendicular to the first surface 21, such as a third direction D3, are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

In some embodiments, the substrate 20 (or any of the substrates disclosed herein) may be made from a material such as semiconductor material, ceramic, glass, liquid crystal polymer material, a composite material such as glass-epoxy or a fiber-reinforced composite, a laminate structure, or a combination thereof. The thickness of the substrate 20 between its first surface 21 and a second surface 22 opposite to the major surface may be less than 1000 μm, and may be significantly smaller, for example, 500 μm, 130 μm, 70 μm or even smaller. In some embodiments, the substrate 20 may be a supporting dielectric element, e.g., a tape used in tape automated bonding ("TAB"). In one example, the substrate 20 may consist essentially of a dielectric element having a coefficient of thermal expansion in a plane of the substrate of less than 10 ppm/° C. In a particular embodiment, the substrate 20 may consist essentially of a dielectric element having a coefficient of thermal expansion in a plane of the substrate of between about 10 and about 20 ppm/° C. In one particular embodiment, the substrate 20 may consist essentially of a dielectric element having a coefficient of thermal expansion in a plane of the substrate of between about 10 and about 20 ppm/° C. and an out-of-plane coefficient of thermal expansion between about 15 and about 60 ppm/° C.

The substrate 20 may be an interposer providing electrical interconnection between the first and second surfaces 21, 22, and/or the substrate may have terminals (not shown) at the second surface configured for electrical connection with a component external to the microelectronic package 10. The substrate 20 may further include conductive structure (not shown) therein. Such conductive structure may include traces extending along one or both of the first and second surfaces 21, 22, conductive interconnects, or conductive vias extending between or in a direction between the first surface and the second surface. In embodiments where the substrate 20 includes a semiconductor substrate, made for example from silicon, one or a plurality of semiconductor devices (e.g., transistors, diodes, etc.) may be disposed in an active device region thereof located at and/or below the respective first and/or second surface 21, 22. The substrate 20 may have substrate contacts 23 at the first surface 21 that are configured to send and/or receive address information and data signals to and/or from the NAND wafer 30. The substrate contacts 23 may be disposed adjacent to a first edge 24 of the first surface 21.

The substrate 20 may further include an insulating dielectric layer (not shown) overlying the first surface 21 and/or the second surface 22. Such dielectric layers may electrically insulate conductive elements from the substrate, when the substrate comprises an electrically conductive material or a semiconductor material. These dielectric layers may be referred to as "passivation layers" of the substrate. Such dielectric layers may include an inorganic or organic dielectric material or both. Such dielectric layers may include an electrodeposited conformal coating or other dielectric material, for example, a photoimageable polymeric material, for example, a solder mask material.

The NAND wafer 30 may be a semiconductor chip that may be implemented in one of various semiconductor materials such as silicon, germanium, and gallium arsenide or one or more other Group III-V semiconductor compounds or Group II-VI semiconductor compounds, etc. The NAND wafer 30 may have a greater number of active devices for providing memory storage array function than for any other function. While the examples herein may refer to NAND memory, it should be understood that the technology described in such examples could also be applied to other devices, such as universal flash storage (UFS), solid state memory, Dynamic Random access memory (DRAM) or other such volatile or non-volatile memory.

The NAND wafer 30 may have a front surface 31 and a rear surface 32 opposite the front surface and one or more columns of element contacts 33 at the front surface 31, each column extending in the first direction D1 along the front surface. The element contacts 33 may be disposed adjacent to a first edge 34 of the front surface 31. The element contacts 33 may be configured to carry address information and data signals to and from the NAND wafer 30.

Electrically conductive structure in the form of wire bonds 60 may extend above the front surface 31. The wire bonds 60 may electrically connect the element contacts 33 with the substrate contacts 23, to send and/or receive address information and data signals between the NAND wafer 30 and the substrate 20. Ends of the wire bonds 60 may be joined to the substrate contacts 23 and the element contacts 33 using electrically conductive masses, such as masses of a bond metal, e.g., tin, indium, solder or a eutectic material, or a conductive matrix material of metal particles embedded in a polymeric material. The NAND wafer 30 may have a plurality of edge surfaces 35 extending between the front and rear surfaces. The rear surface 32 of the NAND wafer 30 may be affixed to the first surface 21 of the substrate 20, for example, using a dielectric adhesive material (not shown).

The bitline driver chiplet 40 may be configured to function as a bitline driver for the NAND wafer 30. In some embodiments, the bitline driver chiplet 40 may also comprise other features, such as analog circuitry and/or page buffers. The bitline driver chiplet 40 may be a semiconductor chip made of similar materials as the NAND wafer 30 and may be mounted to the front surface 31 of the NAND wafer adjacent to the first edge 34.

The bitline driver chiplet 40 may have a front surface 41 facing the front surface of the NAND wafer 30 and a rear surface 42 opposite therefrom. The bitline driver chiplet 40 may have a rectangular cross-section and may be elongated in the first direction D1. Electrically conductive contacts (not shown) at a front surface 41 of the bitline driver chiplet 40 may be electrically connected with corresponding electrically conductive contacts (not shown) at the front surface 31 of the NAND wafer 30.

The bitline driver chiplet 40 may be bonded in a stacked arrangement with the NAND wafer 30 using various bonding techniques, including using direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). This process may enable the bitline driver chiplet 40 to bond to the NAND wafer 30 with adjacent electrical connections at an extremely fine pitch. For example, the connection may be at a pitch as low as approximately 1μ-10μ. In such a direct bonding example, the rear surface 42 of the bitline driver chiplet 40 may be laminated onto a confronting exposed front surface 31 the NAND wafer 30, and heat and pressure may be used to bond the confronting surfaces to one another.

The wordline driver chiplet 50 may be configured to function as a wordline driver for the NAND wafer 30. In some embodiments, the wordline driver chiplet 50 may also comprise other features, such as analog circuitry, digital circuitry, and/or page buffers. The wordline driver chiplet 50 may be a semiconductor chip made of similar materials as the NAND wafer 30 and may be mounted to the front surface 31 of the NAND wafer at a centerline C of the front surface that extends in the second direction D2.

The wordline driver chiplet 50 may have a front surface 51 facing the front surface of the NAND wafer 30 and a rear surface 52 opposite therefrom. The wordline driver chiplet 50 may have a rectangular cross-section and may be elongated in the second direction D2, such that the wordline driver chiplet is elongated in a direction that is perpendicular to the direction in which the bitline driver chiplet 40 extends. Electrically conductive contacts (not shown) at a front surface 51 of the wordline driver chiplet 50 may be electrically connected with corresponding electrically conductive contacts (not shown) at the front surface 31 of the NAND wafer 30.

The wordline driver chiplet 50 may be bonded in a stacked arrangement with the NAND wafer 30 using the bonding techniques that are mentioned above with respect to the bitline driver chiplet 40. Such bonding techniques may enable the wordline driver chiplet 50 to bond to the NAND wafer 30 with adjacent electrical connections at an extremely fine pitch. For example, the connection may be at a pitch as low as approximately 1μ-10μ.

Compared to a conventional design in which the bitline driver and the wordline driver are provided in a wafer similar in size to the NAND wafer 30, the bitline driver chiplet 40 and the wordline driver chiplet 50 use much less semiconductor material, thereby potentially resulting in significant cost savings producing the microelectronic package 10 compared to conventional designs.

Figure 2:
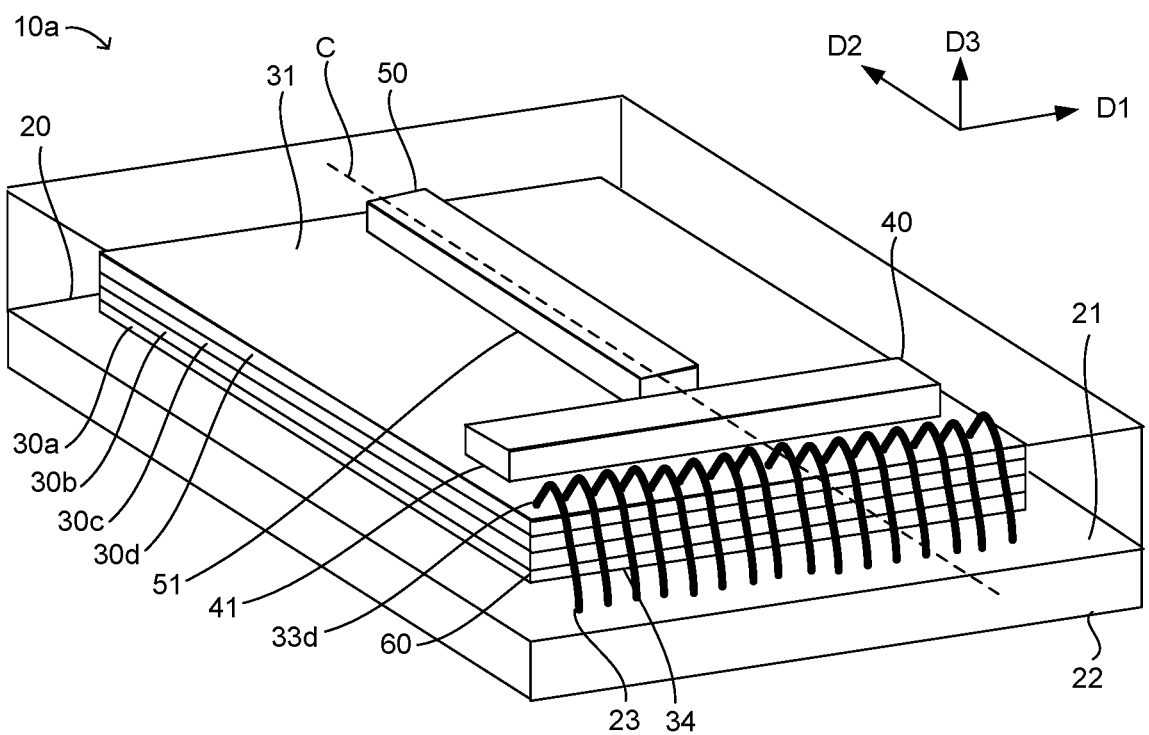
FIG. 2 is a perspective view of a microelectronic package having stacked NAND wafers with wire bonds to a substrate and shared bitline and wordline driver chiplets.

As illustrated in FIG. 2, a microelectronic package 10a, which is a variation of the microelectronic package 10, may comprise a substrate 20 having first and second surfaces 21, 22, a plurality of NAND wafers including first, second, third, and fourth wafers 30a, 30b, 30c, and 30d arranged in a vertical stack that is mounted to the first surface, a bitline driver chiplet 40, a wordline driver chiplet 50, and wire bonds 60. Any features of the microelectronic package 10a that are not described herein are the same as those described above with respect to the microelectronic package 10.

The plurality of NAND wafers are arranged in a vertical stack with a lower surface of first wafer 30a being affixed to the first surface 21 of the substrate 20, for example, using a dielectric adhesive material (not shown). A lower surface of the second wafer 30b may be affixed to an upper surface of the first wafer 30a, a lower surface of the third wafer 30c may be affixed to an upper surface of the second wafer 30b, and a lower surface of the fourth wafer 30d may be affixed to an upper surface of the third wafer 30c. An upper surface of the fourth wafer 30d may be exposed at the top of the vertical stack.

The plurality of NAND wafers 30a, 30b, 30c, and 30d may be bonded in a stacked arrangement with one another and with the substrate 20 using the bonding techniques that are mentioned above with respect to the bitline driver chiplet 40. Such bonding techniques may enable adjacent electrical connections between adjacent ones of the wafers 30a, 30b, 30c, and 30d and between the first wafer 30a and the substrate 20 at an extremely fine pitch.

The exposed upper surface of the fourth wafer 30d may be a front surface 31 of the fourth wafer that has one or more columns of element contacts 33d exposed thereat, each column extending in the first direction D1 along the front surface. The element contacts 33d may be disposed adjacent to a first edge 34 of the front surface 31. The element contacts 33d may be configured to carry address information and data signals to and from the NAND wafers 30a, 30b, 30c, and 30d. The wire bonds 60 may electrically connect the element contacts 33d with the substrate contacts 23, to send and/or receive address information and data signals between the NAND wafers 30a, 30b, 30c, and 30d and the substrate 20.

In the example shown in FIG. 2, the vertical stack of NAND wafers comprises four wafers 30a, 30b, 30c, and 30d, although in other examples, the stack may comprise any number of wafers, such as two, three, four, five, eight, ten, or more than ten, but preferably a number of wafers that is an integer power of 2, such as two, four, eight, sixteen, or thirty-two.

A single bitline driver chiplet 40 may be configured to function as a bitline driver for all of the first-fourth wafers 30a-30d. In some embodiments, the bitline driver chiplet 40 may also comprise other features, such as analog circuitry and/or page buffers. The bitline driver chiplet 40 may be mounted to the front surface 31 of the fourth wafer 30d adjacent to the first edge 34.

The bitline driver chiplet 40 may have a rectangular cross-section and may be elongated in the first direction D1. Electrically conductive contacts (not shown) at a front surface 41 of the bitline driver chiplet 40 may be electrically connected with corresponding electrically conductive contacts (not shown) at the front surface 31 of the fourth wafer 30d. The bitline driver chiplet 40 may be bonded in a stacked arrangement with the fourth wafer 30d using various bonding techniques, such as the direct dielectric bonding, non-adhesive techniques that are mentioned above. Such bonding techniques may enable electrical connections between the fourth wafer 30d and the bitline driver chiplet 40 at an extremely fine pitch.

A single wordline driver chiplet 50 may be configured to function as a wordline driver for all of the first-fourth wafers 30a-30d. In some embodiments, the wordline driver chiplet 50 may also comprise other features, such as analog circuitry and/or page buffers. The wordline driver chiplet 50 may be mounted to the front surface 31 of the fourth wafer 30d at a centerline C of the front surface that extends in the second direction D2.

The wordline driver chiplet 50 may have a rectangular cross-section and may be elongated in the second direction D2. Electrically conductive contacts (not shown) at a front surface 51 of the wordline driver chiplet 50 may be electrically connected with corresponding electrically conductive contacts (not shown) at the front surface 31 of the fourth wafer 30d. The wordline driver chiplet 50 may be bonded in a stacked arrangement with the fourth wafer 30d using various bonding techniques, such as the direct dielectric bonding, non-adhesive techniques that are mentioned above. Such bonding techniques may enable electrical connections between the fourth wafer 30d and the wordline driver chiplet 50 at an extremely fine pitch.

As illustrated in FIG. 3, a microelectronic package 10b, which is a variation of the microelectronic package 10a, may comprise a substrate 20 having first and second surfaces 21, 22, a plurality of NAND wafers including first and second wafers 30a, 30b, arranged in a vertical stack on the first surface with respective first and second bitline driver chiplets 40a, 40b, and respective first and second wordline driver chiplets 50a and 50b, and wire bonds 60a, 60b. Any features of the microelectronic package 10b that are not described herein are the same as those described above with respect to the microelectronic package 10a.

A lower surface of first wafer 30a may be affixed to the first surface 21 of the substrate 20, for example, using a dielectric adhesive material (not shown). Lower surfaces of each of the first bitline driver chiplet 40a and the first wordline driver chiplet 50a may be affixed to an upper surface of the first wafer 30a. A lower surface of the second wafer 30b may be affixed to upper surfaces of each of the first bitline driver chiplet 40a and the first wordline driver chiplet 50a. Lower surfaces of each of the second bitline driver chiplet 40b and the second wordline driver chiplet 50b may be affixed to an upper surface of the second wafer 30b. Upper surfaces of the second bitline driver chiplet 40b and the second wordline driver chiplet 50b may be exposed at the top of the vertical stack.

The NAND wafers 30a, 30b, the bitline driver chiplets 40a, 40b, and the wordline driver chiplets 50a, 50b may be bonded in a stacked arrangement with one another and with the substrate 20 using various bonding techniques, such as the direct dielectric bonding, non-adhesive techniques that are mentioned above. Such bonding techniques may enable adjacent electrical connections between adjacent ones of the wafers 30a, 30b, bitline driver chiplets 40a, 40b, wordline driver chiplets 50a, 50b, and the substrate 20 at an extremely fine pitch.

The upper surface of each of the first wafer 30a and the second wafer 30b may be a front surface 31 that has one or more respective columns of element contacts 33a, 33b exposed thereat, each column extending in the first direction D1 along the front surface. The element contacts 33a, 33b may each be disposed adjacent to a first edge 34 of the respective front surface 31. The element contacts 33a and 33b may be configured to carry address information and data signals to and from the respective NAND wafers 30a and 30b. The wire bonds 60a and 60b may electrically connect the respective element contacts 33a and 33b with the substrate contacts 23, to send and/or receive address information and data signals between the NAND wafers 30a and 30b and the substrate 20.

In the example shown in FIG. 3, vertical stack of NAND wafers comprises two wafers 30a and 30b, although in other examples, the stack may comprise any number of wafers, such as two, three, four, five, eight, ten, or more than ten, but preferably a number of wafers that is an integer power of 2, such as two, four, eight, sixteen, or thirty-two.

In this embodiment, each NAND wafer 30a and 30b has a separate bitline driver chiplet 40a or 40b configured to function as a bitline driver for the respective NAND wafer, a separate wordline driver chiplet 50a or 50b configured to function as a wordline driver for the respective NAND wafer, and separate electrical connections to the substrate 20 in the form of wire bonds 60a or 60b. In some embodiments, each bitline driver chiplet 40a, 40b and/or each wordline driver chiplet 50a, 50b may also comprise other features, such as analog circuitry and/or page buffers. Each bitline driver chiplet 40a, 40b may be mounted to the front surface 31 of the respective wafer 30a, 30b adjacent to the first edge 34. Each wordline driver chiplet 50a, 50b may be mounted to the front surface 31 of the respective wafer 30a, 30b at a centerline C of the front surface that extends in the second direction D2.

Each bitline driver chiplet 40a, 40b may have a rectangular cross-section and may be elongated in the first direction D1. Electrically conductive contacts (not shown) at a front surface 41 of each bitline driver chiplet 40a, 40b may be electrically connected with corresponding electrically conductive contacts (not shown) at the front surface 31 of the corresponding wafer 30a, 30b. Each bitline driver chiplet 40a, 40b may be bonded in a stacked arrangement with the respective wafer 30a, 30b using various bonding techniques, such as the direct dielectric bonding, non-adhesive techniques that are mentioned above. Such bonding techniques may enable electrical connections between each wafer 30a, 30b and the respective bitline driver chiplet 40a, 40b at an extremely fine pitch.

The wordline driver chiplet 50a, 50b may have a rectangular cross-section and may be elongated in the second direction D2. Electrically conductive contacts (not shown) at a front surface 51 of each wordline driver chiplet 50a, 50b may be electrically connected with corresponding electrically conductive contacts (not shown) at the front surface 31 of the corresponding wafer 30a, 30b. Each wordline driver chiplet 50a, 50b may be bonded in a stacked arrangement with the respective wafer 30a, 30b using various bonding techniques, such as the direct dielectric bonding, non-adhesive techniques that are mentioned above. Such bonding techniques may enable electrical connections between each wafer 30a, 30b and the respective wordline driver chiplet 50a, 50b at an extremely fine pitch.

As illustrated in FIG. 4, a microelectronic package 10c, which is a variation of the microelectronic package 10b, may comprise a substrate 20 having first and second surfaces 21, 22, a plurality of NAND wafers including first, second, third, and fourth 30a, 30b, 30c, and 30d arranged in a vertical stack on the first surface with respective first, second, third, and fourth bitline driver chiplets 40a, 40b, 40c, and 40d, and respective first, second, third, and fourth wordline driver chiplets 50a, 50b, 50c, and 50d, and wire bonds 60a, 60b, 60c, and 60d. Any features of the microelectronic package 10c that are not described herein are the same as those described above with respect to the microelectronic package 10b. Other than having four sets of corresponding NAND wafers, bitline driver chiplets, wordline driver chiplets, and wire bonds, the microelectronic package 10c shown in FIG. 4 is the same as the microelectronic package 10b shown in FIG. 3.

As illustrated in FIG. 5, a microelectronic package 10d, which is a variation of the microelectronic package 10c, is the same as the microelectronic package 10c except that the plurality of NAND wafers 30a, 30b, 30c, and 30d, the bitline driver chiplets, and the wordline driver chiplets are arranged in a staggered vertical stack, with each successively higher NAND wafer (and the corresponding bitline driver chiplet and wordline driver chiplet) being moved slightly in the second direction D2 relative to the NAND wafer underneath by an offset distance D4. Any features of the microelectronic package 10d that are not described herein are the same as those described above with respect to the microelectronic package 10c.

Also different than the microelectronic package 10c is that the microelectronic package 10d has wire bonds 60a, 60b, 60c, and 60d arranged in a waterfall pattern, in which the first wire bonds 60a electrically connect the element contacts 33a to the substrate contacts 23, but the wire bonds of each successively higher NAND wafer only extend to the element contacts of the NAND wafer underneath. For example, the second wire bonds 60b electrically connect the second element contacts 33b to the first element contacts 33a, the third wire bonds 60c electrically connect the third element contacts 33c to the second element contacts 33b, and the fourth wire bonds 60d electrically connect the fourth element contacts 33d to the third element contacts 33c.

In each of the examples shown in FIGS. 4 and 5, the vertical stack of NAND wafers comprises four wafers 30a, 30b, 30c, and 30d, although in other examples, the stack may comprise any number of wafers, such as two, three, four, five, eight, ten, or more than ten, but preferably a number of wafers that is an integer power of 2, such as two, four, eight, sixteen, or thirty-two.

As illustrated in FIG. 6, a microelectronic package 10e, which is a variation of the microelectronic package 10d, is the same as the microelectronic package 10d except that the plurality of NAND wafers 30a, 30b, and 30c, the bitline driver chiplets, and the wordline driver chiplets are arranged in a vertical stack that is staggered in both the first and second directions D1 and D2, with each successively higher NAND wafer (and the corresponding bitline driver chiplet and wordline driver chiplet) being moved slightly in both the second and first directions relative to the NAND wafer underneath by respective offset distances D4 and D5. Also, the microelectronic package 10e shown in FIG. 6 has three NAND wafers 30a, 30b, and 30c, but in other examples, the stack may comprise any number of wafers, such as two, three, four, five, eight, ten, or more than ten, but preferably a number of wafers that is an integer power of 2, such as two, four, eight, sixteen, or thirty-two. Any features of the microelectronic package 10e that are not described herein are the same as those described above with respect to the microelectronic package 10d.

Also different than the microelectronic package 10d is that the microelectronic package 10e has two sets of wire bonds 60a, 60b, 60c, and 60a', 60b', and 60c' arranged in two separate waterfall patterns, with the wire bonds 60a, 60b, and 60c being disposed adjacent the first edge 34 of the front surface 31 of each NAND wafer 30a, 30b, and 30c, and with the wire bonds 60a', 60b', and 60c' being disposed against a second edge 36 of the front surface of each NAND wafer adjacent the first edge.

As illustrated in FIG. 7, a microelectronic package 10f, which is a variation of the microelectronic package 10c, is the same as the microelectronic package 10c except that the plurality of NAND wafers 30a, 30b, 30c, and 30d, the bitline driver chiplets, and the wordline driver chiplets have alternating orthogonal orientations of the long sides 35a of the NAND wafers within the vertical stack, with odd numbered NAND wafers in the stack, i.e., the first and third wafers 30a, 30c (and the corresponding bitline driver chiplets 40 and wordline driver chiplets 50) being rotated by 90° relative to the even numbered NAND wafers in the stack, i.e., the second and fourth wafers 30b, 30d. Any features of the microelectronic package 10f that are not described herein are the same as those described above with respect to the microelectronic package 10c.

Also different than the microelectronic package 10c is that each of the NAND wafers 30a, 30b, 30c, and 30d has wire bonds extending from the short sides 35b thereof. Therefore, the first wafer 30a has wire bonds 60a and 60a' extending from opposite short sides of the wafer in directions parallel to the second direction D2, and the third wafer 30c has wire bonds 60c and 60c' extending from opposite short sides of the wafer in the same directions. Consequently, the second wafer 30b has wire bonds 60b and 60b' extending from opposite short sides of the wafer in directions parallel to the first direction D1, and the fourth wafer 30d has wire bonds 60d and 60d' extending from opposite short sides of the wafer in the same directions.

In the example shown in FIG. 7, the vertical stack of NAND wafers comprises four wafers 30a, 30b, 30c, and 30d, although in other examples, the stack may comprise any number of wafers, such as two, three, four, five, eight, ten, or more than ten, but preferably a number of wafers that is an integer power of 2, such as two, four, eight, sixteen, or thirty-two.

Figure 8:
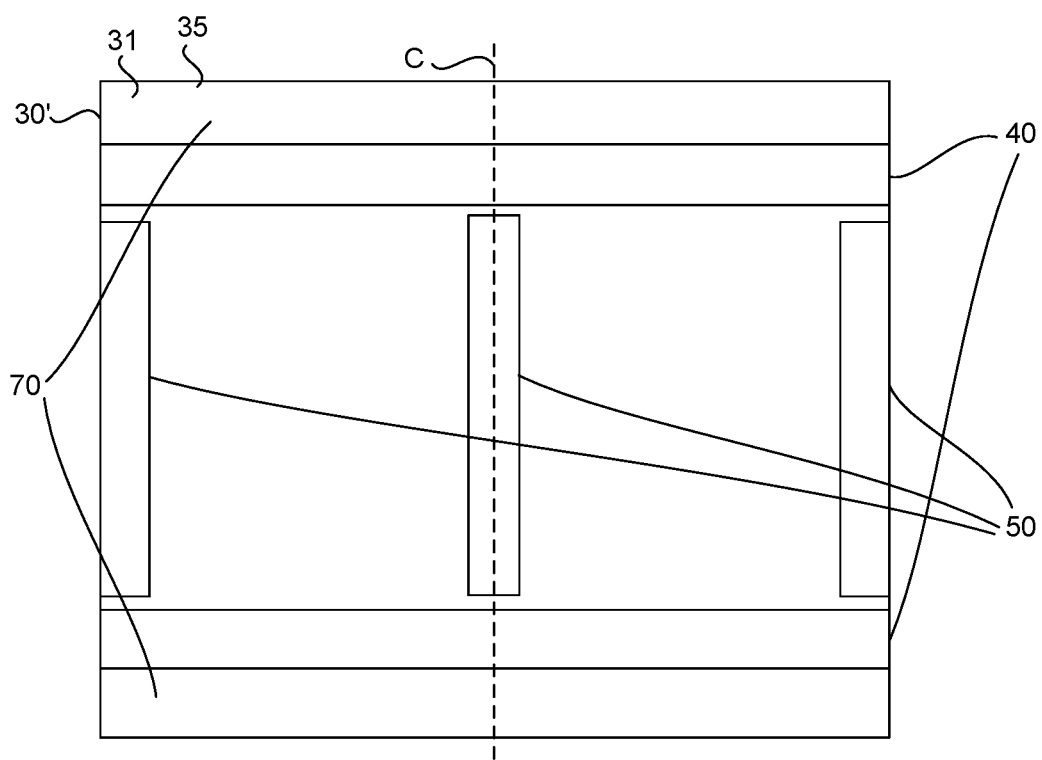
FIG. 8 is a top view of a variation of the NAND wafer and bitline and wordline driver chiplets of FIG. 1.

As illustrated in FIG. 8, a NAND wafer 30', which is a variation of the NAND wafer 30 shown in FIGS. 1-7, is the same as the NAND wafer 30 described above, but with the exceptions noted below. Any features of the NAND wafer 30' that are not described herein are the same as those described above with respect to the NAND wafer 30. The NAND wafer 30' may be used in place of the NAND wafer 30 in any of the embodiments described above.

The NAND wafer 30' may have a plurality of bitline driver chiplets 40 and a plurality of wordline driver chiplets 50. For example, as shown in FIG. 8, the NAND wafer 30' has two bitline driver chiplets 40 disposed at opposite sides of the front surface 31 of the NAND wafer, and three wordline driver chiplets 50 disposed at opposite sides of the front surface and also along a centerline C of the front surface. In other examples, the NAND wafer 30' can have any number of bitline driver chiplets 40, such as three, four, or five, and any number of wordline driver chiplets 50, such as two, four, or five. The NAND wafer 30' also has two peripheral regions 70 that may contain additional peripheral circuits disposed between the bitline driver chiplets 40 and the adjacent peripheral edge 35 of the wafer.

The microelectronic packages described above with reference to FIGS. 1-8 above can be utilized in construction of diverse electronic systems, such as the system 100 shown in FIG. 49. For example, the system 100 in accordance with a further embodiment of the invention includes a plurality of modules or components 106 such as the microelectronic packages described above, in conjunction with other electronic components 108, 110 and 111.

In the exemplary system 100 shown, the system can include a circuit panel, motherboard, or riser panel 102 such as a flexible printed circuit board, and the circuit panel can include numerous conductors 104, of which only one is depicted in FIG. 49, interconnecting the modules or components 106, 108, 110 with one another. Such a circuit panel 102 can transport signals to and from each of the microelectronic packages and/or microelectronic assemblies included in the system 100. However, this is merely exemplary; any suitable structure for making electrical connections between the modules or components 106 can be used.

In a particular embodiment, the system 100 can also include a processor such as the semiconductor chip 108, such that each module or component 106 can be configured to transfer a number N of data bits in parallel in a clock cycle, and the processor can be configured to transfer a number M of data bits in parallel in a clock cycle, M being greater than or equal to N.

Figure 9:
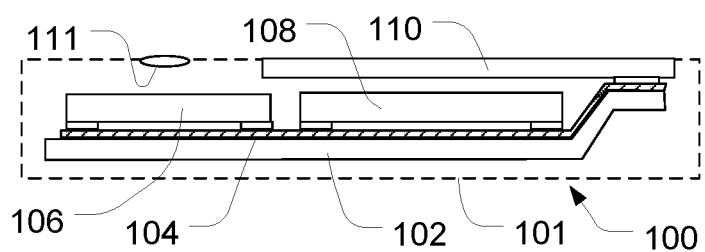
FIG. 9 illustrates an example system according to aspects of the disclosure.

In the example depicted in FIG. 49, the component 108 is a semiconductor chip and component 110 is a display screen, but any other components can be used in the system 100. Of course, although only two additional components 108 and 111 are depicted in FIG. 9 for clarity of illustration, the system 100 can include any number of such components.

Modules or components 106 and components 108 and 111 can be mounted in a common housing 101, schematically depicted in broken lines, and can be electrically interconnected with one another as necessary to form the desired circuit. The housing 101 is depicted as a portable housing of the type usable, for example, in a cellular telephone or personal digital assistant, and screen 110 can be exposed at the surface of the housing. In embodiments where a structure 106 includes a light-sensitive element such as an imaging chip, a lens 111 or other optical device also can be provided for routing light to the structure. Again, the simplified system shown in FIG. 49 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments. For example, the microelectronic package 10b shown in FIG. 3 may be modified to have wire bonds 60 extending from opposite ends of each of the NAND wafers 30, as is shown in the microelectronic package 10f of FIG. 7.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
a substrate having first and second opposite surfaces each extending in first and second orthogonal directions;
a NAND wafer having a memory storage array therein, the NAND wafer having element contacts electrically connected with electrically conductive structure of the substrate, the NAND wafer being coupled to the first surface of the substrate;
a bitline driver chiplet configured to function as a bitline driver for the NAND wafer, the bitline driver chiplet being elongated along the first direction and mounted to a front surface of the NAND wafer; and
a wordline driver chiplet configured to function as a wordline driver for the NAND wafer, the wordline driver chiplet being elongated along the second direction and mounted to the front surface of the NAND wafer,
wherein front surfaces of the bitline driver chiplet and the wordline driver chiplet are arranged in a single common plane and are entirely contained within an outer periphery of the front surface of the NAND wafer.

2. The microelectronic package of claim 1, wherein bitline driver chiplet is disposed adjacent to a first peripheral edge of the front surface of the NAND wafer, and the wordline driver chiplet is disposed along a centerline of the front surface that bisects the first peripheral edge.

3. The microelectronic package of claim 1, wherein the front surface of the bitline driver chiplet and the front surface of the wordline driver chiplet are directly bonded to the front surface of the NAND wafer without the use of an adhesive.

4. The microelectronic package of claim 1, wherein the bitline driver chiplet is a first bitline driver chiplet and the wordline driver chiplet is a first wordline driver chiplet, the microelectronic package further comprising a plurality of bitline driver chiplets including the first bitline driver chiplet and a plurality of wordline driver chiplets including the first wordline driver chiplet, each of the bitline driver chiplets being spaced apart from one another, elongated along the first direction, and mounted to the front surface of the NAND wafer, and each of the wordline driver chiplets being spaced apart from one another, elongated along the second direction, and mounted to the front surface of the NAND wafer.

5. The microelectronic package of claim 1, further comprising a plurality of wire bonds extending above the front surface of the NAND wafer, the plurality of wire bonds extending between the element contacts and substrate contacts at the first surface of the substrate.

6. The microelectronic package of claim 1, wherein the NAND wafer is a first NAND wafer, the microelectronic package further comprising a plurality of NAND wafers including the first NAND wafer, the plurality of NAND wafers being arranged in a vertical stack and coupled to the first surface of the substrate.

7. The microelectronic package of claim 6, wherein the bitline driver chiplet is configured to function as a bitline driver that is shared by each of the plurality of NAND wafers, and the wordline driver chiplet is configured to function as a wordline driver that is shared by each of the plurality of NAND wafers.

8. The microelectronic package of claim 7, further comprising a plurality of wire bonds extending above the front surface of the first NAND wafer, the plurality of wire bonds extending between the element contacts of the first NAND wafer and substrate contacts at the first surface of the substrate, the plurality of wire bonds being configured to carry address information and data signals to each of the plurality of NAND wafers.

9. The microelectronic package of claim 7, wherein an upper surface of each of the plurality of NAND wafers that is below the first NAND wafer is directly bonded to a lower surface of the NAND wafer that is directly thereabove in the stack without the use of an adhesive.

10. The microelectronic package of claim 6, wherein the bitline driver chiplet is a first bitline driver chiplet and the wordline driver chiplet is a first wordline driver chiplet, the microelectronic package further comprising a plurality of bitline driver chiplets including the first bitline driver chiplet and a plurality of wordline driver chiplets including the first wordline driver chiplet, each of the bitline driver chiplets and each of the wordline driver chiplets being mounted to a corresponding one of the plurality of NAND wafers.

11. The microelectronic package of claim 10, further comprising a plurality of groups of wire bonds, each group of wire bonds extending above the front surface of a respective one of the NAND wafers, each group of wire bonds extending between element contacts of the respective one of the NAND wafers and substrate contacts at the first surface of the substrate.

12. The microelectronic package of claim 6, wherein plurality of NAND wafers are arranged in a staircase configuration, such that each of the plurality of NAND wafers that is below the first NAND wafer is horizontally offset from the NAND wafer that is directly thereabove in the stack by an offset distance in either the first direction or the second direction.

13. The microelectronic package of claim 12, further comprising a plurality of groups of wire bonds, each group of wire bonds extending above the front surface of a respective one of the NAND wafers, element contacts of each of the plurality of NAND wafers that is below the first NAND wafer being connected to element contacts of the NAND wafer that is directly thereabove in the stack by one of the groups of wire bonds.

14. The microelectronic package of claim 6, wherein plurality of NAND wafers are arranged in a staircase configuration, such that each of the plurality of NAND wafers that is below the first NAND wafer is horizontally offset from the NAND wafer that is directly thereabove in the stack by a first offset distance in the first direction and by a second offset distance in the second direction.

15. The microelectronic package of claim 14, further comprising a plurality of groups of wire bonds, each group of wire bonds extending above the front surface of a respective one of the NAND wafers, element contacts of each of the plurality of NAND wafers that is below the first NAND wafer being connected to element contacts of the NAND wafer that is directly thereabove in the stack by one of the groups of wire bonds, each group of wire bonds having a first subset that extends over a first edge of the respective one of the NAND wafers and a second subset that extends over a second edge of the respective one of the NAND wafers adjacent to the first edge.

16. The microelectronic package of claim 6, wherein plurality of NAND wafers are arranged in an alternating orthogonal configuration, such that long sides of each of the plurality of NAND wafers that is below the first NAND wafer are rotated 90° relative to long sides of the NAND wafer that is directly thereabove in the stack.

17. The microelectronic package of claim 16, further comprising a plurality of groups of wire bonds, each group of wire bonds extending above the front surface of a respective one of the NAND wafers, each group of wire bonds extending between element contacts of the respective one of the NAND wafers and substrate contacts at the first surface of the substrate, each group of wire bonds having a first subset that extends over a first short edge of the respective one of the NAND wafers and a second subset that extends over a second edge of the respective one of the NAND wafers opposite from the first edge.

18. A microelectronic assembly including the microelectronic package of claim 1, further comprising a circuit panel having panel contacts, wherein the terminals at the second surface of the microelectronic package are bonded to the panel contacts.

19. A system comprising a microelectronic package according to claim 1 and one or more other electronic components electrically connected to the microelectronic package.

20. The system as claimed in claim 19, further comprising a housing, the microelectronic package and the other electronic components being mounted to the housing.

21. A microelectronic package, comprising:
a substrate having first and second opposite surfaces each extending in first and second orthogonal directions;
a plurality of microelectronic elements arranged in a vertical stack and coupled to the first surface of the substrate; the microelectronic elements each having element contacts electrically connected with electrically conductive structure of the substrate; and
a plurality of chiplets arranged within the vertical stack and coupled to the plurality of microelectronic elements, the chiplets being alternatingly interleaved with the microelectronic elements within the vertical stack such that at least one of the microelectronic elements is directly coupled to multiple chiplets, circuitry of each of the chiplets being electrically connected with circuitry of at least one of the microelectronic elements,
wherein front surfaces of each of the chiplets are entirely contained within an outer periphery of the front surfaces of each of the microelectronic elements.

22. The microelectronic package of claim 21, wherein the plurality of chiplets coupled to the at least one of the microelectronics includes a first chiplet and a second chiplet with a space existing between the first chiplet and the second chiplet.

23. A method of assembling a microelectronic package, the method comprising:
providing a substrate having first and second opposite surfaces each extending in first and second orthogonal directions;
coupling a NAND wafer to the first surface of the substrate, the NAND wafer having a memory storage array therein;
electrically connecting element contacts of the NAND wafer with electrically conductive structure of the substrate;
mounting a bitline driver chiplet to a front surface of the NAND wafer, the bitline driver chiplet configured to function as a bitline driver for the NAND wafer, the bitline driver chiplet being elongated along the first direction; and
mounting a wordline driver chiplet to the front surface of the NAND wafer, the wordline driver chiplet configured to function as a wordline driver for the NAND wafer, the wordline driver chiplet being elongated along the second direction,
wherein front surfaces of the bitline driver chiplet and the wordline driver chiplet are arranged in a single common plane and are entirely contained within an outer periphery of the front surface of the NAND wafer.

* * * * *